United States Patent [19]

Arens et al.

[11] Patent Number: 5,301,364
[45] Date of Patent: Apr. 5, 1994

[54] METHOD AND APPARATUS FOR DIGITAL AUTOMATIC GAIN CONTROL IN A RECEIVER

[75] Inventors: John W. Arens, Cary; David E. Borth, Palatine; James F. M. Kepler, Northbrook, all of Ill.

[73] Assignee: Motorola, Inc., Schaumburg, Ill.

[21] Appl. No.: 26,616

[22] Filed: Mar. 4, 1993

Related U.S. Application Data

[63] Continuation of Ser. No. 515,900, Apr. 27, 1990, abandoned, which is a continuation-in-part of Ser. No. 278,051, Nov. 30, 1988, abandoned.

[51] Int. Cl.$^5$ ............................................. H04B 1/06
[52] U.S. Cl. ................................. 455/69; 455/234.2; 455/240.1; 455/33.2; 375/98; 370/95.3
[58] Field of Search ............... 455/69, 234.1, 234.2, 455/240.1, 241.1, 250.1, 251.1, 311, 254, 33.2; 375/98; 370/77, 94.1, 95.1, 95.3; 379/60

[56] References Cited

U.S. PATENT DOCUMENTS

| | | | |
|---|---|---|---|
| 4,227,256 | 10/1980 | O'Keefe | 330/124 R |
| 4,330,859 | 5/1982 | Takada | 455/251 |
| 4,546,326 | 10/1985 | Van Uffelen et al. | 330/279 |
| 4,656,630 | 4/1987 | Miyo | 370/104 |
| 4,696,027 | 9/1987 | Bonta | 379/60 |
| 4,742,565 | 5/1988 | Iwahashi | 455/250 |
| 4,757,502 | 7/1988 | Meuriche et al. | 370/94.1 |
| 4,829,593 | 5/1989 | Hara | 455/234 |
| 5,012,491 | 4/1991 | Iwasaki | 375/98 |
| 5,204,977 | 4/1993 | Feldt | 455/234.2 |

OTHER PUBLICATIONS

"Digital Automatic Gain Control", *NASA Tech Briefs*, Fall 1979, Vzday, Z. p. 329.

Primary Examiner—Reinhard J. Eisenzopf
Assistant Examiner—Andrew Faile
Attorney, Agent, or Firm—Richard A. Sonnentag

[57] ABSTRACT

There is provided a mechanism for Automatic Gain Control in a receiver. It comprises: determining, within a certain dynamic range, the difference in power between the desired signal and a signal received, and providing open loop gain control for the signal in response to the differential so determined, scaled by the receiver's gain characteristics, such that the signal is positioned within dynamic range so as to reduce saturation and noise.

6 Claims, 4 Drawing Sheets

METHOD AND APPARATUS FOR DIGITAL AUTOMATIC GAIN CONTROL IN A RECEIVER

RELATED APPLICATIONS

This application is a continuation of application Ser. No. 07/515,900, filed Apr. 27, 1990 and now abandoned which is a continuation-in-part application of Ser. No. 07/278,051 filed Nov. 30, 1988 now abandoned and assigned to the instant assignee from which priority is claimed.

THE FIELD OF INVENTION

This invention is concerned with digital automatic gain control. More particularly, this invention is concerned with Automatic Gain Control (AGC) for discontinuous signals in a receiver having limited dynamic range.

BACKGROUND OF THE INVENTION

Although the concept of Automatic Gain Control (AGC) in radio signal reception is well understood, automatic gain control of Time Division multiplexed Multiple Access (TDMA) signals presents new challenges to the land-mobile industry.

In wideband TDMA systems, such as the cellular system proposed for use in Europe, an RF channel is shared (time-division-multiplexed) among numerous subscribers attempting to access the radio system in certain ones of various time-division-multiplexed time slots. The time slots are arranged into periodically repeating frames. Thus, a radio communication of interest may be periodically discontinuous—interleaved with unrelated signals transmitted in other time slots. The unrelated signals (of widely varying strength) must not influence the gain control of the signals of interest. A formidable challenge then is to provide Automatic Gain Control of these periodically discontinuous TDMA signals.

The challenge is further enhanced by attempting to provide digital AGC in inexpensive receivers—those having limited dynamic range. Since these signals may vary by as much as 100 dB in the land-mobile environment, but modest 8-bit Analog-to-Digital converters (A/D) for digital signal processing are limited to 48 dB dynamic range, techniques must be developed for controlling the gain of the signal to keep it within the limited dynamic range of the receiver. The challenge then is to handle a 100 dB discontinuous signal with a 48 dB device; otherwise, prohibitively expensive A/Ds with greater dynamic range must be utilized.

Another challenge for gain control is introduced by the digital nature of these TDMA transmission systems. Gaussian Minimum Shift Keying (GMSK) modulates the quadrature phases of the signal such that the power of the received signal is more dimicult to measure, and neither of the quadrature phases, taken alone, is proportional to the received signal power.

This invention takes as its object to overcome these challenges and realize certain advantages, presented below.

SUMMARY OF THE INVENTION

In accordance with the preferred embodiment of the invention, there is provided a mechanism for Automatic Gain Control in a receiver. It comprises: determining, within a certain dynamic range, the difference in power between the desired signal and a signal received, and providing open loop gain control for the signal in response to the differential so determined, scaled by the receive?'s gain characteristics, such that the signal is positioned within dynamic range so as to reduce saturation and noise.

In accordance with one embodiment of the invention, there is provided a method of digital Automatic Gain Control (AGC) in a receiver having limited dynamic range, particularly for discontinuous signals. The method comprises detecting the level of a received and AGC'D discontinuous signal, comparing the level of the AGC'D signal relative to the dynamic range of the receiver, and adjusting the AGC to establish a desired relationship between the AGC'd signal and the dynamic range limitation. There is also provided a method of handoff in a TDMA cellular-type transmission system utilizing this method of AGC control.

The method for Automatic Gain Control (AGC) of discontinuous signals in a receiver having limited dynamic range is further characterized by: digitizing a received and AGC'd discontinuous signal and converting the digitized samples to a power sample to sense the power of and detect the level of the signal, comparing the level of the AGC'd signal relative to the dynamic range of the receiver; and coarsely-adjusting by either progressively attenuating the signal until it falls within the dynamic range of the receiver or by progressively gain-amplifying the signal until it falls within the limited dynamic range of the receiver and finely-adjusting the AGC of the received signal until optimum use of the full (albeit limited) dynamic range of the signal processing stages is about 6–12 dB below the maximum to establish a desired relationship between the AGC'd signal and the dynamic range limitation.

BRIEF DESCRIPTION OF THE DRAWINGS

Additional objects, features, and advantages of the invention will be more clearly understood and the best mode contemplated for practicing it in its preferred embodiment will be appreciated (by way of unrestricted example) from the following detailed description, taken together with the accompanying drawings in which.

DETAILED DESCRIPTION

Figure 1:
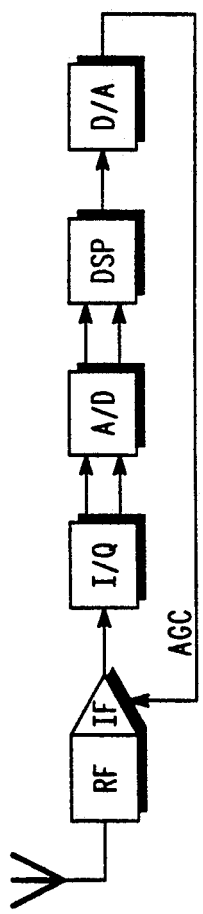
FIG. 1 is a simplified block diagram of the invention.

FIG. 1 is a simplified block diagram of the invention; it illustrates gain control in a digital quadrature receiver. It illustrates, in series, an RF receiver section (IF), a quadrature demodulator (I/Q) having In-phase and Quadrature phases, Analog-to-Digital converters (A/D), a Digital Signal Processor (DSP), and a Digital-to-Analog converter (D/A) providing Automatic Gain Control (AGC) to the receiver section (RF/IF).

In operation, the signal is received, converted to an intermediate frequency and gain amplified in the receiver section (RF/IF); quadrature demodulated (I/Q)

into In-phase and Quadrature components; digitized in Analog-to-Digital converters of limited dynamic range (A/D); and converted to a power sample in the Digital Signal Processors (DSP) to detect the level of the signal. In the Digital Signal Processors (DSP), the signal level is compared relative to the dynamic range of the receiver, and the AGC is adjusted in the Digital-to-Analog converter (D/A) to establish a desired relationship between the AGC'd signal and the dynamic range limitation of the receiver.

More concretely, the power level of the AGC'd signal is compared relative to a desired power level in the stage having the dynamic range limitation.

Figure 2:
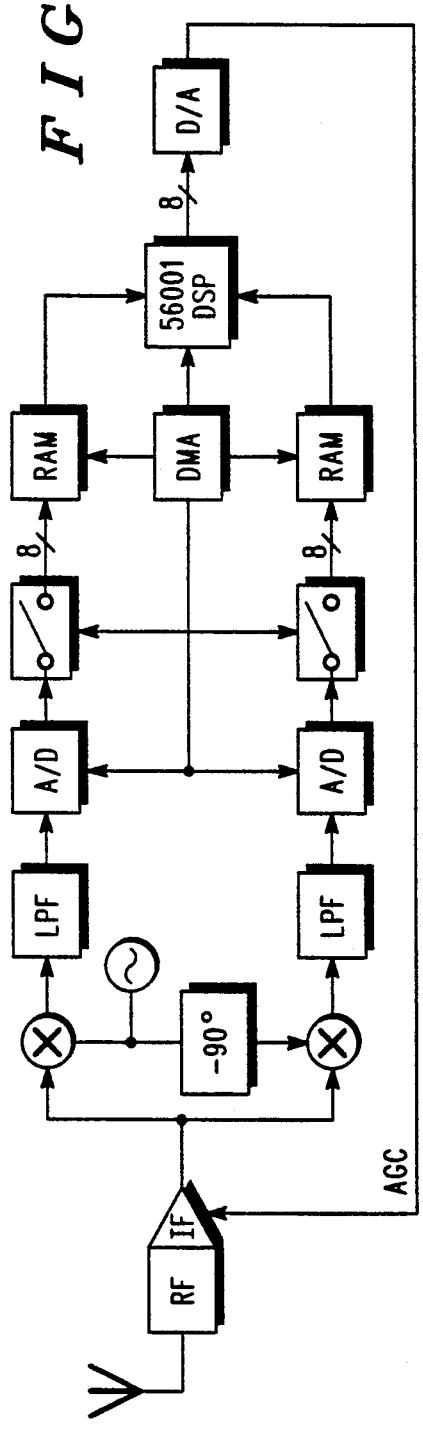
FIG. 2 is a functional block diagram of the preferred embodiment of the invention.

FIG. 2 is a functional block diagram of the preferred embodiment of the invention. FIG. 2 illustrates, in line, an RF receiver section (RF/IF); a quadrature demodulator (I/Q) having In-phase (I) and Quadrature (Q) phase mixers whose outputs are Low Pass Filtered (LPF); and, under Direct Memory Access control (DMA), 8-bit Analog-to-Digital converters (A/D), tristate gates, Random Access Memories (RAM), and a 56001 Digital Signal Processor (56001 DSP); and a latching Digital-to-Analog converter (D/A) providing Automatic Gain Control (AGC) to the receiver section (IF). This GMSK receiver is comprised of a conventional RF stage, mixing and filtering that feeds a 10.7 MHz IF signal to a conventional AGC-type IF amplifier (IF), such as a Motorola MC1350. The IF amplifier feeds a conventional I/Q demodulator comprised of a 10.7 MHz local oscillator, a 90 degree phase shifter, a pair of mixers and a pair of low pass filters (LPF). The 8-bit flash A/Ds, such as RCA CA3318CE's, provide 48 dB of dynamic range and are, in large part, responsible for the dynamic range limitation of the receiver. A Motorola 56001 Digital Signal Processor (56001 DSP) is used for signal acquisition, signal level detection, and AGC control. The 56001 DSP is supported by conventional clock and timing circuitry (not shown) and ROMs for programmed control (not shown). An Analog Devices 7528LN is suitable as the latching Digital-to-Analog converter (D/A) that provides Automatic Gain Control (AGC) to the receiver section (IF).

The receiver operates in a TDMA system having 8 time slots in each 4.8 millisecond frame; 135 kilobits/second are transmitted in each quadrature phase. In operation, for each time slot, a retained previous AGC setting is fetched (DMA) from memory (RAM) through the Digital Signal Processor (56001 DSP) and applied to the Digital-to-Analog converter (D/A), providing Automatic Gain Control (AGC) to the receiver section (RF/IF). The received signal, after being gain-controlled and quadrature-demodulated is digitized by the Analog-to-Digital converters (A/D) to provide multiple pairs of samples per bit interval, which are stored in memory (RAM) under Direct Memory Access control (DMA) of the tri-state gates. The samples are retrieved from memory (RAM) and converted in the 56001 DSP to a power sample by summing N pairs (32 to 128 pairs in the preferred embodiment) to obtain a Q value and an I value, and taking the square root of the sum of the squares of the Q and I values. The square root is proportional to the average power of the received signal (an instantaneous power sample from a single pair cannot be reliably obtained due to the variability in the received signal strength). A preferred alternative measure for the power sample may be obtained by simply summing the squares of the Q and I values.

Again, more concretely, the power level of the AGC'd signal is compared relative to a desired power level in the stage having the dynamic range limitation. Thus, to prevent short-term saturation of the 8-bit Analog-to-Digital converters (A/D), the AGC wants to establish and maintain the level of the AGC'd signal at a nominal level of about 6–12 dB (9 dB in the preferred embodiment) below the maximum output of the A/D.

Figure 3:
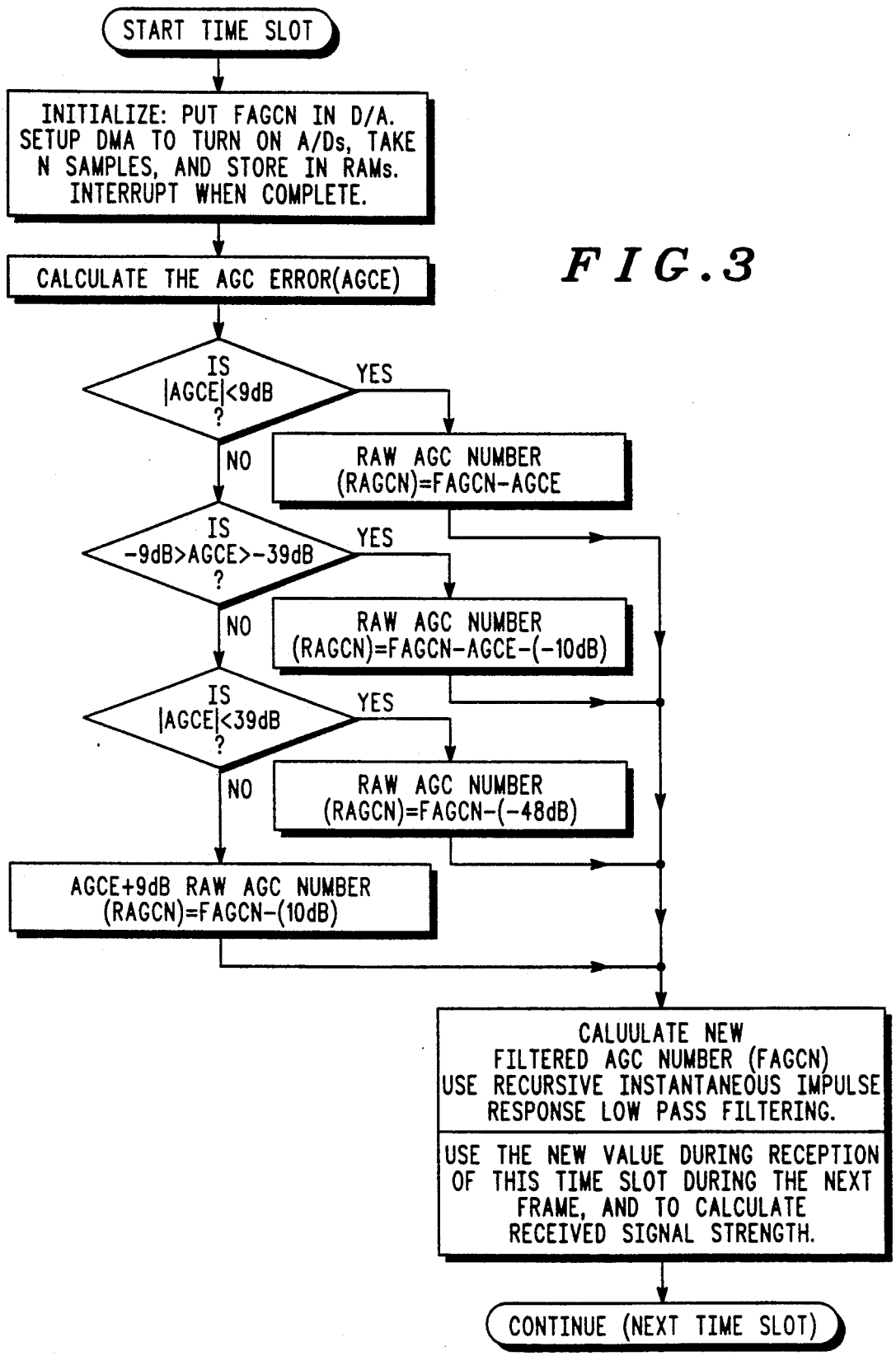
FIG. 3 is a diagram of the AGC control process according to the invention.

FIG. 3 is a diagram of the AGC control process according to the invention.

The basic control process is to:

detect the level of a received and AGC'd discontinuous signal, compare the level of the AGC'd signal relative to the dynamic range of the receiver, and adjust the AGC to establish a desired relationship between the AGC'd signal and the dynamic range limitation.

The average power, as measured above, is then subtracted from a power level representative of the desired nominal level (or 9 dB, hereinafter given as 0 db reference) to calculate the power error. This calculated power error is further factored by an adjustment that compensates for the overall loop gain characteristics, resofting in an AGC Error (AGCE). If the AGC Error (AGCE) is within the margin below full output (9 dB), then the prevailing AGC setting (Filtered AGC Number—FAGCN) is finely adjusted by the amount of the Error (AGCE). If the Error is greater than the margin (9 dB) but inside the dynamic range of the A/D (48 dB−9 dB=39 dB), then adjust by the amount of the Error (AGCE) plus slightly more than the margin (9 dB+1 dB=10 dB). If the Error falls below the dynamic range of the A/D, then coarsely-adjust by the amount of the dynamic range (48 dB); if the Error is above the dynamic range, then adjust by slightly more than the margin (9 dB+1 dB=10 dB). Finally, the current Error calculation and the previous gain setting (FAGCN) become the inputs to a digitally recursive infinite impulse response low pass filter (which is well understood by those ordinarily skilled in the art) to derive a new Filtered AGC Number (FAGCN). Thus, the signal is progressively gain-amplified (or gain-attenuated) until the signal falls within the dynamic range of the A/Ds and is further amplified (or attenuated) until optimum use (with appropriate margin) of the full (albeit limited) dynamic range of the A/Ds is obtained. The result of these various approximations for a plurality of TDM time slots may then be retained in memory (RAM) for resuming AGC control when the respective signals are expected to resume.

Furthermore, as these various gain calculation results are representative of the actually received signal strength (with appropriate compensation for overall loop gain characteristics), these gain determinations can be reported to the transmitting station for purposes of establishing transmission gain levels that optimally utilize the dynamic range of the receiver, thereby increasing spectral efficiency and frequency reuse in the system—particularly cellular systems. Moreover, in a cellular-type system, the signal strength (gain determination) may be reported to the transmitting station by the receiver and hand off the transmission when the AGC adjustment crosses a certain threshold. Also, the signal strength (AGC level) of an adjacent cell (time slot) can be determined and evaluated to facilitate hand-off.

Figure 4:
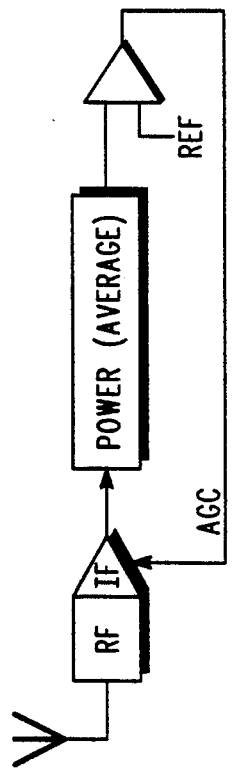
FIG. 4 is a simplified diagram of an alternate embodiment of the invention.

FIG. 4 is a simplified diagram of an alternate embodiment of the invention. It illustrates an analog implementation of Automatic Gain Control that utilizes a power averaging circuit and comparator to implement the control process of FIG. 3, described above. The power averaging circuit is well known by those ordinarily skilled in the relevant art and can readily be adapted to conform to the control process described above.

In summary then, there has been provided a method of digital Automatic Gain Control (AGC) in a receiver having limited dynamic range, particularly for discontinuous signals. The method comprises detecting the level of a received and AGC'd discontinuous signal, comparing the level of the AGC'd signal relative to the dynamic range of the receiver, and adjusting the AGC to establish a desired relationship between the AGC'd signal and the dynamic range limitation. There has also been provided a method of handoff in a TDMA cellular-type transmission system utilizing this method of AGC control.

The method for Automatic Gain Control (AGC) of discontinuous signals in a receiver having limited dynamic range has further been characterized by: digitizing a received and AGC'd discontinuous signal and converting the digitized samples to a power sample to sense the power of and detect the level of the signal, comparing the level of the AGC'd signal relative to the dynamic range of the receiver; and coarsely-adjusting by either progressively attenuating the signal until it falls within the dynamic range of the receiver or by progressively gain-amplifying the signal until it falls within the limited dynamic range of the receiver and finely-adjusting the AGC of the received signal until optimum use of the full (albeit limited) dynamic range of the signal processing stages is about 6–12 dB below maximum sensitivity to establish a desired relationship between the AGC'd signal and the dynamic range limitation.

This discussion presupposed that the A/Ds provide the most severe constraint on the dynamic range of the receiver; however, this invention is equally applicable without regard to the particular stage providing the most severe constraint on the dynamic range of the receiver. Accordingly, all discussion has been framed in terms of the limited dynamic range of the receiver.

Figure 5:
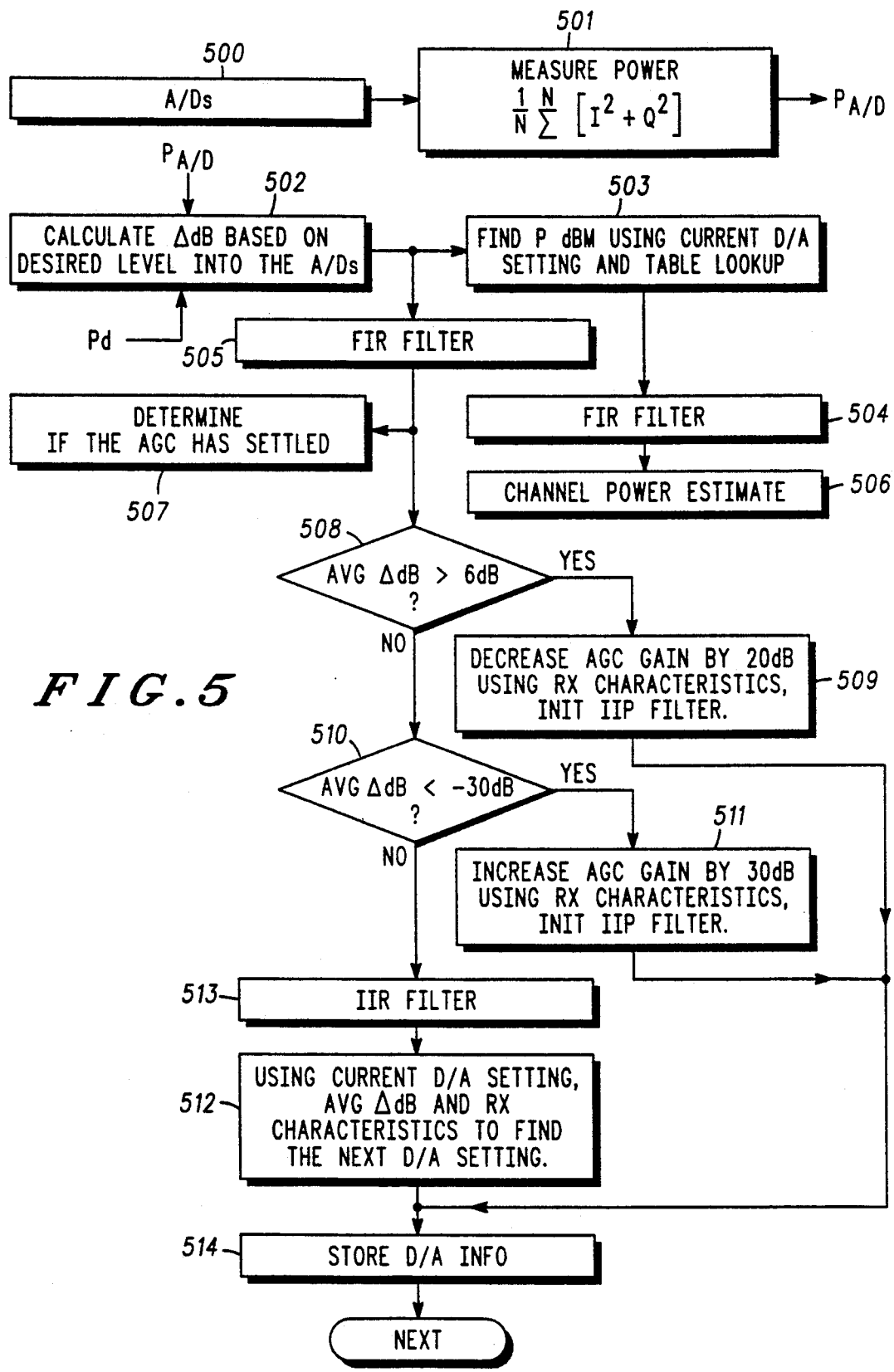
FIG. 5 is a diagram of a preferred embodiment of the AGC control process according to the invention.

FIG. 5 is a diagram of a preferred embodiment of the AGC control process according to the invention. It illustrates the control process for an open loop improvement to the digital AGC presented thus far. The foregoing embodiment iteratively settled on the proper AGC through progressive, closed loop control. This preferred embodiment utilizes a lookup table (incorporating all the receiver characteristics and nonlinearities, including the A/D non-linearities) with the calculated difference in power between that desired to obtain maximum utilization of the A/D dynamic range and the current actual power received at the A/Ds as an index into the table to obtain the next AGC setting required to settle at the desired power level.

The table is derived in a laboratory setting where the AGC (power) level is established at the desired level while the power generated from a signal generator coupled to the antenna input necessary to establish certain power differentials at the A/Ds is noted. In this fashion, the AGC level required for any given power differential can be extrapolated.

All of the signal processing of FIG. 5 takes place in the digital signal processor (DSP) of FIGS. 1 and 2. Returning to FIG. 5, the power seen at the A/Ds is calculated (501) as the sum over sixty-four samples of the squares of the demodulated (I/Q) signal samples. The difference in power ($\Delta$dB) between that seen at the A/Ds ($P_{A/D}$) and that desired ($P_d$) is determined (502). The power ($P_{dBm}$) during the timeslot is determined (503) from the curred D/A setting and the power differential ($\Delta$dB) and then indexing into the lookup table with the to find the power for that timeslot. As has been mentioned, the lookup table is a function of the receiver's gain control characteristics. This $P_{dBm}$ selling from many timeslots (comprising the discontinuous communication) is averaged in an FIR filter (504) to form a better power estimate of the faded signal that is reported to the transmitter for handoff determinations (506).

The power differential ($\Delta$dB) itself is also averaged over several timeslots (since the AGC cannot track through signal fades) in an FIR filter (505) to determine the average power difference (AVG$\Delta$DB) from the desired ($P_d$) to determine when AGC settling has occurred (507). If this short-term average error (AVG$\Delta$DB) is not greater than, say, half-scale (6 dB) off of A/D saturation (508) and not less than (510) the noise quantization level ($-30$ dB), then an IIR filter, or "leaky integrator," (513) determines the speed of the AGC response to correct the present D/A setting by table lookup (512). This updated D/A value is then stored (514) for use with subsequent timeslots.

Figure 6:
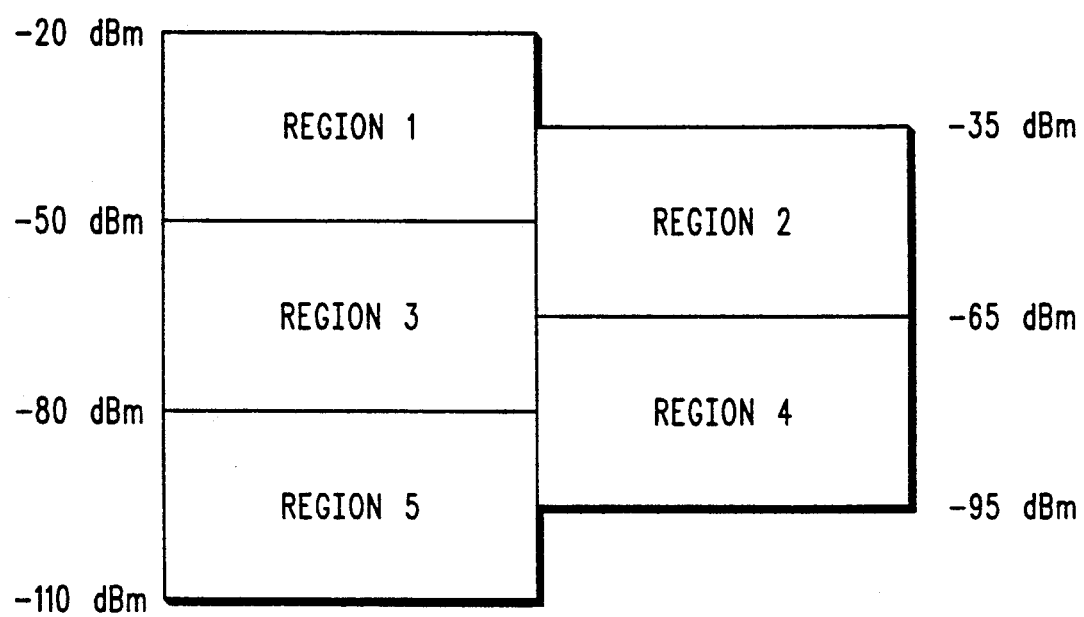
FIG. 6 illustrates five overlapping regions of the useful A/D range (30 dB) spanning the expected signal range of −20 dB to −110 dB.

In those few instances where the signal's power is not within the A/Ds (useful) range—i.e., the average power differential is not within the usable ($+6$ dB through $-30$ dB) dynamic range of the 8-bit A/Ds (48 dB)—the useful range of the A/Ds is windowed up through gain reduction (509) when the signal is clipped and the A/Ds are saturated and windowed down through increased gain (511) when noise quantization occurs and the signal is insufficiently strong (see FIG. 6). The AGC gain is scaled (and the A/Ds window adjusted) by the receiver's gain control characteristics, incorporated in the lookup table (509 and 511). Additionally, the filters (505 and 513) are reinitialized to avoid averaging in now irrelevant information.

FIG. 5 illustrated the AGC control process for tracking timeslots comprising one communication that is discontinuously transmitted. In alternate timeslots, the receiver may, while idle, be monitoring up to 32 other carders with strength varying across the entire $-20$ dB to $-110$ dB range (see FIG. 6). This same basic process is employed for this adjacent cell monitoring. However, to accommodate the much less frequent peeks at the other carriers, each carrier is sampled just three times during the multi-frame and the filter coefficients (504, 505 and 513) must be adjusted for this slower AGC control (for example, the IIR filter 513 averages over eight samples for monitoring, rather than the thirty-two for tracking, so that it becomes more responsive for monitoring). Similarly, the saturation headroom (508) is increased from the tracking value of 6 dB to 15 dB because there is less certainty that the signal may be at the previously observed power level.

In brief summary, there has been provided a mechanism for Automatic Gain Control in a receiver. It comprises: determining, within a certain dynamic range, the difference in power between the desired signal and a signal received, and providing open loop gain control for the signal in response to the differential so determined, scaled by the receiver's gain characteristics, such that the signal is positioned within dynamic range so as to reduce saturation and noise.

While the preferred embodiment of the invention has been described and shown, it will be appreciated by those skilled in the art that other variations and modifications of this invention may be implemented. For example, this invention need not be limited to TDMA land-mobile systems, but is adaptable to AGC of digital and analog signals, including AM, FM or TV signals.

These and all other variations and adaptations are expected to fall within the ambit of the appended claims.

What we claim and desire to secure by Letters Patent is:

1. A method of Automatic Gain Control in a receiver, the receiver having a gain-controlled stage and a known gain-controlled characteristic, the receiver receiving discontinuous signals, the method comprising the steps of:

digitizing a demodulated received signal in one predetermined time slot, the receiver having a previous gain setting set by a previous digital-to-analog converter setting;

determining a power level of said digitized received signal;

calculating an error signal by comparing said determined level to a predetermined desired reference level;

calculating a channel power estimate of the strength of said digitized received signal within a specified predetermined time period and prior to receiving a next predetermined time slot by using the previous digital-to-analog converter setting and previously stored data of the gain-controlled characteristic of said receiver in a lookup table to determine a first channel power estimate of the digitized time slot, adding said calculated error signal to said first channel power estimate, and filtering the resultant sum with a first digital low-pass filter;

passing said error signal through a second digital low-pass filter to provide an average error signal that is averaged over a plurality of time slots;

determining if valid power measurements are available by comparing said average error signal to a predetermined range;

coarsely decreasing said gain in the receiver within the specified predetermined time period and prior to receiving the next predetermined time slot by a predetermined amount if said calculated average error signal is greater than an upper limit of a first predetermined margin;

coarsely increasing said gain in the receiver within the specified predetermined time period and prior to receiving the next predetermined time slot by an amount substantially equal to a second predetermined margin if said calculated average error signal is less than a lower limit of said predetermined margin;

finely adjusting said gain in the receiver within the specified predetermined time period and prior to receiving the next predetermined time slot by an amount that is determined by filtering said average error signal with a third digital low-pass filter and using said lookup table to obtain the desired digital-to-analog converter setting that corresponds to said previous gain setting summed with said filtered average error signal, if said calculated average error signal is less than an upper limit of said first predetermined margin and greater than a lower limit of said second predetermined margin; and storing said desired digital-to-analog converter setting.

2. The method as claimed in claim 1 wherein an indication related to said determined power level of said digitized received signal is reported by the receiver to a transmitting station to establish transmission levels that efficaciously utilize the receivers dynamic range.

3. The method as claimed in claim 1 wherein an indication related to said determined power level of said digitized received signal is reported by the receiver to a transmitting station to facilitate handoff determinations in a cellular system.

4. The method as claimed in claim 3 further comprising the step of handing-off transmissions when the indication passes a certain threshold in a cellular system.

5. The method as claimed in claim 1 wherein a determined power level of an alternate digitized received signal transmitted by an alternate transmitting station is evaluated to facilitate handoff determinations.

6. An apparatus for Automatic Gain Control in a receiver, the receiver having a gain-controlled stage and a known gain-controlled characteristic, the receiver receiving discontinuous signals, the apparatus comprising:

means for digitizing a received signal; operatively coupled with means for determining a power level of said digitized received signal, means for calculating an error signal by comparing said determined level to the predetermined desired reference level, means for calculating a channel power estimate of the strength of said digitized received signal within a specified predetermined time period and prior to receiving the next predetermined time slot by using the previous digital-to-analog converter setting and previously stored data of the gain-controlled characteristic of said receiver in a lookup table to determine a first channel power estimate of the digitized time slot, means for adding said calculated error signal to said first channel power estimate, and filtering the resultant sum with a first digital low-pass filter, means for passing said error signal through a second digital low-pass filter to provide an average error signal that is averaged over a plurality of time slots, means for determining if valid power measurements are available by comparing said average error signal to a predetermined range;

means for coarsely decreasing said gain in the receiver with the specified predetermined time period and prior to receiving the next predetermined time slot by a predetermined amount if said calculated average error signal is greater than an upper limit of a first predetermined margin, means for coarsely increasing said gain in the receiver with the specified predetermined time period and prior to receiving the next predetermined time slot by an amount substantially equal to a second predetermined margin is if said calculated average error signal is less than a lower limit of said predetermined margin, means for finely adjusting said gain in the receiver within the specified predetermined time period and prior to receiving the next predetermined time slot by an amount that is determined by filtering said average error signal wit a third digital low-pass filter and using said lookup table to obtain the desired digital-to-analog converter setting that corresponds to said previous gain setting summed with said filtered average error signal, if said calculated average error signal is less than an upper limit of said first predetermined margin and greater than a lower limit of said second predetermined margin; and means for storing said desired digital-to-analog converter setting.

* * * * *

UNITED STATES PATENT AND TRADEMARK OFFICE
CERTIFICATE OF CORRECTION

PATENT NO. : 5,301,364

DATED : April 5, 1994

INVENTOR(S) : Arens et al.

It is certified that error appears in the above-indentified patent and that said Letters Patent is hereby corrected as shown below:

Col. 8, line 51, please delete "with", and insert therefor --within--.
Col. 8, line 57, please delete "with", and insert therefor --within--.
Col. 8, line 67, please delete "wit", and insert therefor --with--.

Signed and Sealed this

Twenty-third Day of August, 1994

Attest:

BRUCE LEHMAN

Attesting Officer

Commissioner of Patents and Trademarks